(12) United States Patent
Hu

(10) Patent No.: US 11,380,660 B2
(45) Date of Patent: Jul. 5, 2022

(54) MANUFACTURING METHOD OF MICRO-LED DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventor: Xiaobo Hu, Shenzhen (CN)

( * ) Notice: Subject to any disclaimer, the term of this patent is extended or adjusted under 35 U.S.C. 154(b) by 200 days.

(21) Appl. No.: 16/757,398

(22) PCT Filed: Mar. 17, 2020

(86) PCT No.: PCT/CN2020/079577
§ 371 (c)(1),
(2) Date: Apr. 19, 2020

(87) PCT Pub. No.: WO2021/098094
PCT Pub. Date: May 27, 2021

(65) Prior Publication Data
US 2021/0407975 A1    Dec. 30, 2021

(30) Foreign Application Priority Data

Nov. 19, 2019  (CN) .......................... 201911133011.6

(51) Int. Cl.
| | |
|---|---|
| *H01L 21/00* | (2006.01) |
| *H01L 25/16* | (2006.01) |
| *H01L 33/48* | (2010.01) |

(52) U.S. Cl.
CPC .......... *H01L 25/167* (2013.01); *H01L 33/486* (2013.01); *H01L 2933/0066* (2013.01)

(58) Field of Classification Search
CPC ................. H01L 25/167; H01L 33/486; H01L 2933/0066
See application file for complete search history.

(56) References Cited

U.S. PATENT DOCUMENTS

| | | | |
|---|---|---|---|
| 2019/0235658 A1* | 8/2019 | Tsai ........................ | G06F 3/044 |
| 2019/0347979 A1 | 11/2019 | Ahmed | |
| 2021/0337673 A1* | 10/2021 | Eom ................... | G02F 1/13452 |
| 2021/0407975 A1* | 12/2021 | Hu ........................ | H01L 25/167 |

FOREIGN PATENT DOCUMENTS

| | | |
|---|---|---|
| CN | 104617121 A | 5/2015 |
| CN | 107910414 A | 4/2018 |
| CN | 109979957 A | 7/2019 |
| CN | 109994579 A | 7/2019 |
| TW | I653694 B | 3/2019 |
| WO | 2017037530 A1 | 3/2017 |

* cited by examiner

*Primary Examiner* — Ismail A Muse

(57) ABSTRACT

The present disclosure provides a manufacturing method of a micro-LED display device. In the method, a display backboard and a substrate are made separately, and then the display backboard and the substrate are synthesized, after the substrate is removed, a micro-LED array, a protective layer, and a transparent electrode layer are formed on the display backboard formed with an LED single crystal film layer. Beneficial effect is that LED transfer bonding can be self-aligned, conventional mass transfer process can be avoided, process is simple, production cost is reduced, and product yield and pixels of the micro-LED display device are greatly improved.

20 Claims, 5 Drawing Sheets

MANUFACTURING METHOD OF MICRO-LED DISPLAY DEVICE

FIELD OF INVENTION

The present disclosure relates to the field of display technologies, and particularly relates to a manufacturing method of a micro-LED display device.

BACKGROUND OF INVENTION

Micro-LEDs have developed into one of hotspots of future display technologies. Compared with present LCD and OLED display devices, micro-LEDs have advantages of fast response times, wide color gamut, high pixel count, and low energy consumption. However, micro-LEDs have many technical difficulties that are complex, especially their key technology: massive transfer technology.

Micro-LED chips need to be transferred to required positions one by one after fabrication is completed. A number of LED chips to be transferred is large, but requirement for positional accuracy after the transfer is high, which requires a lot of resources. With continuous development of present technology, there have been many technical branches in development of mass transfer technology, such as electrostatic adsorption, laser firing, etc.

A conventional method for mass transferring of micro-LEDs is to transfer micro elements from a transfer substrate to a receiving substrate through wafer bonding. One implementation method of the transfer method is direct transfer, that is, directly bonding the micro-element array from the transfer substrate to the receiving substrate, and then removing the transfer substrate, and the other implementation method is "indirect transfer", which includes two steps of bonding/peeling. In the indirect transfer, transposition heads can pick up a part of the micro-element array on an intermediate carrier substrate, then bond the micro-element array to the receiving substrate, and then remove the transposition heads. However, in the prior art, direct or indirect mass transfer technology has complicated processes and high costs.

Therefore, in present micro-LED display device technology, there is also a technology that requires direct mass transfer or indirect mass transfer in manufacturing process of micro-LEDs, but the processes of these two technologies are relatively complicated and costly, and they need to be improved.

Technical Problems

The present disclosure relates to a manufacturing method of a micro-LED display device, which is provided to solve problems in the present technology that: direct mass transfer or indirect mass transfer technology is required in manufacturing process of micro-LEDs, but the processes of these two technologies are relatively complicated and costly.

Technical Solutions

In order to solve the above problems, the technical solutions provided in the present disclosure are as follows:

The present disclosure provides a manufacturing method of a micro-LED display device including following steps:

S10, providing a substrate and depositing an LED single crystal film layer on the substrate, wherein an ambient temperature is greater than 1000° C.;

S20, providing a display backboard, manufacturing a driving circuit on the display backboard, and disposing touch spots on a side of the driving circuit facing away from the display backboard;

S30, covering a dielectric layer on the driving circuit of the display backboard, and defining through holes in the dielectric layer, and the through holes directly facing the touch spots;

S40, forming molten metal dots above the touch spots along the through holes;

S50, aligning the substrate on which the LED single crystal film layer is deposited with the display backboard, so that one side of the LED single crystal film layer is directly opposite to a side of the dielectric layer having the metal dots;

S60, applying pressure to the substrate facing away from the LED single crystal film layer and a side of the display backboard facing away from the dielectric layer, respectively, so that the LED single crystal film layer and the dielectric layer are completely attached and bonded together;

S70, peeling the substrate from an entirety of the LED single crystal film layer and the display backboard;

S80, performing a yellow light and an etching process on a side of the LED single crystal film layer facing away from the display backboard to form a micro-LED array; and S90, filling a protective layer and a transparent electrode layer on a side of the dielectric layer facing away from the display backboard to form a complete micro-LED display device.

According to a preferred embodiment provided in the present disclosure, in the step S10, the LED single crystal film layer is prepared by a chemical vapour deposition method of a metal organic compound.

According to a preferred embodiment provided in the present disclosure, in the step S10, the substrate is a sapphire substrate, a silicon carbide substrate, or a silicon substrate.

According to a preferred embodiment provided in the present disclosure, the dielectric layer is made of silicon oxide, silicon nitride, or insulating organic material.

According to a preferred embodiment provided in the present disclosure, a height of the dielectric layer is greater than a sum of heights of the driving circuit and the touch spot; and A width of the through holes is less than a width of the driving circuit and is greater than a width of the touch spots.

According to a preferred embodiment provided in the present disclosure, the molten metal dots are made of metallic tin.

According to a preferred embodiment provided in the present disclosure, when the substrate provided with the LED single crystal film layer and the display backboard provided with the dielectric layer are bonded in step S60, the LED single crystal film layer and the dielectric layer are bonded with a low melting metal material.

According to a preferred embodiment provided in the present disclosure, the low melting metal material is tin, indium, lead, or bismuth.

According to a preferred embodiment provided in the present disclosure, bonding between the LED single crystal film layer and the dielectric layer is performed by a low-temperature welding technology.

According to a preferred embodiment provided in the present disclosure, in the step S70, the substrate is peeled by laser.

The present disclosure provides a manufacturing method of a micro-LED display device including following steps:

S10, providing a substrate and depositing an LED single crystal film layer on the substrate;

S20, providing a display backboard, manufacturing a driving circuit on the display backboard, and disposing touch spots on a side of the driving circuit facing away from the display backboard;

S30, covering a dielectric layer on the driving circuit of the display backboard, and defining through holes in the dielectric layer, and the through holes directly facing the touch spots;

S40, forming molten metal dots above the touch spots along the through holes;

S50, aligning the substrate on which the LED single crystal film layer is deposited with the display backboard, so that one side of the LED single crystal film layer is directly opposite to a side of the dielectric layer having the metal dots;

S60, applying pressure to the substrate facing away from the LED single crystal film layer and a side of the display backboard facing away from the dielectric layer, respectively, so that the LED single crystal film layer and the dielectric layer are completely attached and bonded together;

S70, peeling the substrate from an entirety of the LED single crystal film layer and the display backboard;

S80, performing a yellow light and an etching process on a side of the LED single crystal film layer facing away from the display backboard to form a micro-LED array; and S90, filling a protective layer and a transparent electrode layer on a side of the dielectric layer facing away from the display backboard to form a complete micro-LED display device.

According to a preferred embodiment provided in the present disclosure, in the step S10, the LED single crystal film layer is prepared by a chemical vapour deposition method of a metal organic compound.

According to a preferred embodiment provided in the present disclosure, in the step S10, the substrate is a sapphire substrate, a silicon carbide substrate, or a silicon substrate.

According to a preferred embodiment provided in the present disclosure, the dielectric layer is made of silicon oxide, silicon nitride, or insulating organic material.

According to a preferred embodiment provided in the present disclosure, a height of the dielectric layer is greater than a sum of heights of the driving circuit and the touch spot; and A width of the through holes is less than a width of the driving circuit and is greater than a width of the touch spots.

According to a preferred embodiment provided in the present disclosure, the molten metal dots are made of metallic tin.

According to a preferred embodiment provided in the present disclosure, when the substrate provided with the LED single crystal film layer and the display backboard provided with the dielectric layer are bonded in step S60, the LED single crystal film layer and the dielectric layer are bonded with a low melting metal material.

According to a preferred embodiment provided in the present disclosure, the low melting metal material is tin, indium, lead, or bismuth.

According to a preferred embodiment provided in the present disclosure, bonding between the LED single crystal film layer and the dielectric layer is performed by a low-temperature welding technology.

According to a preferred embodiment provided in the present disclosure, in the step S70, the substrate is peeled by laser.

BENEFICIAL EFFECTS

Compared with the prior art, beneficial effects of the manufacturing method of the micro-LED display device provided in the present disclosure are: the manufacturing method of the micro-LED display device provided by the present disclosure can self-align the LED transfer bonding, prevent conventional mass transfer process, simplify the process, reduce the production cost, and greatly improve product yield and pixels of the micro-LED display device.

DESCRIPTION OF DRAWINGS

In order to explain technical solutions in the embodiments of the present disclosure more clearly, drawings used in description of the embodiments will be briefly introduced below. Obviously, the drawings in the following description are just some embodiments of the present disclosure. For those skilled in the art, other drawings can be obtained according to these drawings without creative efforts.

DETAILED DESCRIPTION OF EMBODIMENTS

Figure 1:
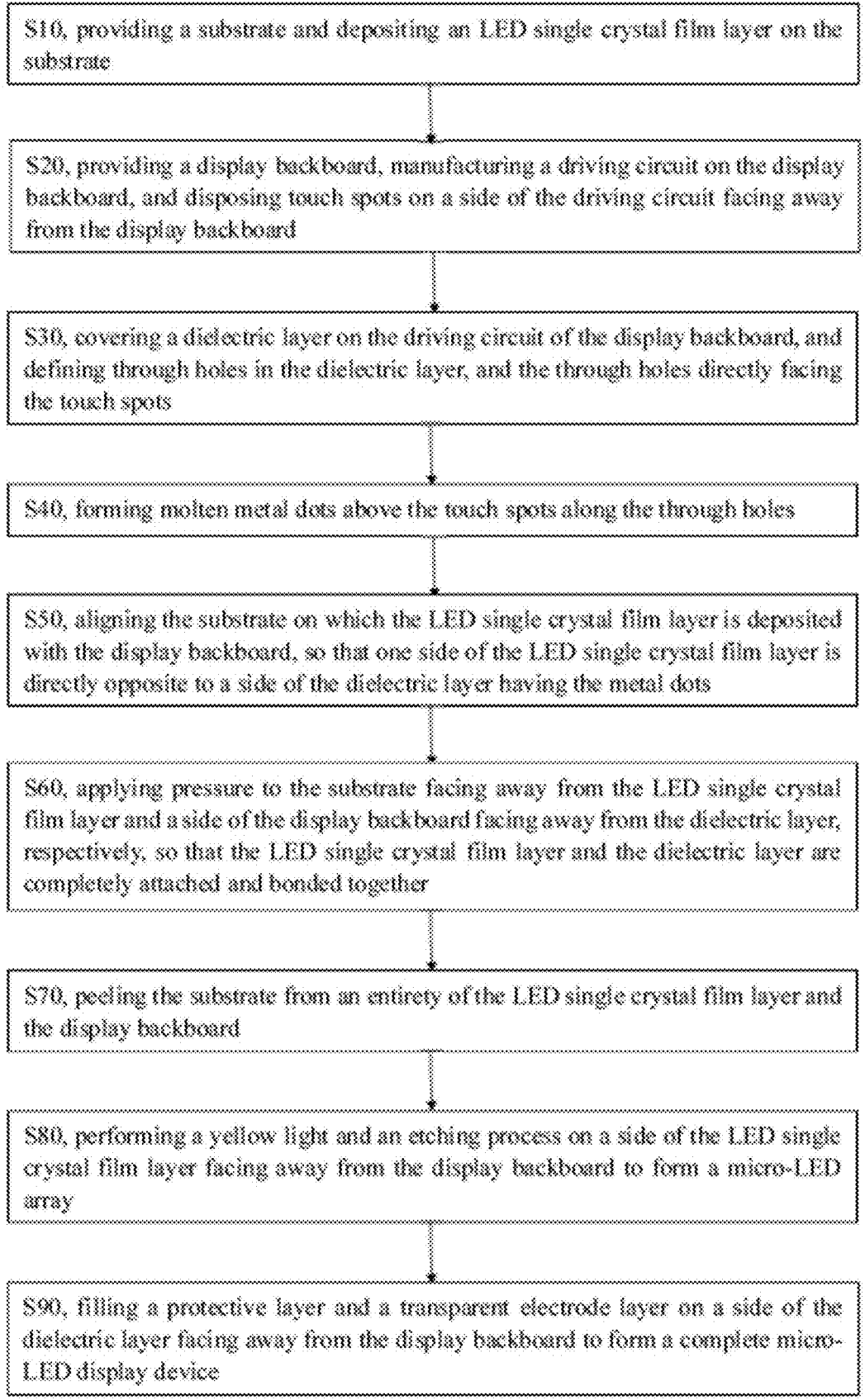
FIG. 1 is a flowchart of a manufacturing method of a micro-LED display device according to an embodiment of the present disclosure.
Figure 2:
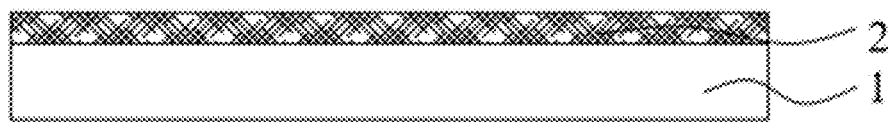
FIG. 2 is a first schematic view of the manufacturing method of the micro-LED display device according to an embodiment of the present disclosure.

The technical solutions in the embodiments of the present disclosure will be clearly and completely described with reference to the accompanying drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative work fall into protection scope of the present disclosure.

In description of the present disclosure, it needs to be understood that, orientational or positional relationships indicated by terms such as "center", "longitudinal", "transverse", "length", "width", "thickness", "up", "down", "front", "rear", "left", "right", "vertical", "horizontal", "top", "bottom", "inside", "outside", "clockwise", "counter-clockwise", etc. are based on orientational or positional relationships shown in the drawings. The terms are only for the convenience of describing the present disclosure and simplifying the description, and does not indicate or imply that devices or elements referred to must have specific orientations, be constructed and operate in specific orientations, and therefore cannot be understood as a limitation on present disclosure. In addition, terms such as "first" and "second" are used herein for purposes of description, and should not be interpreted as indication or implication of relative importance, or implied indication of a number of the technical features. Therefore, features limited by terms such as "first" and "second" can explicitly or impliedly includes one or more than one these features. In description of the disclosure, "a plurality of" means two or more than two, unless otherwise specified.

In description of the present disclosure, it should be noted, the terms "install", "connect", and "couple" shall be understood broadly, unless otherwise explicitly stated and defined, and may be, for example, a fixed connection, a detachable connection, or an integral connection; a mechanical connection or an electrical connection; directly connected or indirectly connected through an intermediate medium; an internal connection of the two elements. The specific meanings of the above terms in the present disclosure can be understood in the specific circumstances for those skilled in the art.

In the present disclosure, unless specifically stated and defined otherwise, that a first feature is "on" or "under" a second feature may include: the first feature and the second feature are not in direct contact but are contacted by another feature between them. Furthermore, that the first feature is "on", "above", or "upon" the second feature includes that the first feature is directly above and obliquely above the second feature, or merely indicates that the first feature is higher in level than the second feature. That the first feature is "under" or "below" the second feature includes that the first feature is directly below and obliquely below the second feature, or merely indicates that the first feature is lower in level than the second feature.

Following disclosure provides various different implementations or examples for implementing different structures of the present disclosure. To simplify the disclosure of the present disclosure, components and settings of specific examples are described below. Of course, they are merely examples and are not intended to limit the present disclosure. In addition, the present disclosure may repeat reference numbers and/or reference letters in different examples, and such repetition is for purpose of simplicity and clarity, and does not indicate relationship between the various embodiments and/or settings discussed. In addition, examples of various specific processes and materials are provided in the present disclosure, but those of ordinary skill in the art may be aware of application of other processes and/or other materials.

The present disclosure provides a manufacturing method of a micro-LED display device, specifically referring to FIGS. 1 to 10.

Referring to FIG. 1, it is a flowchart of the manufacturing method of the micro-LED display device according to an embodiment of the present disclosure. The method includes following steps: S10, providing a substrate and depositing an LED single crystal film layer on the substrate; S20, providing a display backboard, manufacturing a driving circuit on the display backboard, and disposing touch spots on a side of the driving circuit facing away from the display backboard; S30, covering a dielectric layer on the driving circuit of the display backboard, and defining through holes in the dielectric layer, and the through holes directly facing the touch spots; S40, forming molten metal dots above the touch spots along the through holes; S50, aligning the substrate on which the LED single crystal film layer is deposited with the display backboard, so that one side of the LED single crystal film layer is directly opposite to a side of the dielectric layer having the metal dots; S60, applying pressure to the substrate facing away from the LED single crystal film layer and a side of the display backboard facing away from the dielectric layer, respectively, so that the LED single crystal film layer and the dielectric layer are completely attached and bonded together; S70, peeling the substrate from an entirety of the LED single crystal film layer and the display backboard; S80, performing a yellow light and an etching process on a side of the LED single crystal film layer facing away from the display backboard to form a micro-LED array; and S90, filling a protective layer and a transparent electrode layer on a side of the dielectric layer facing away from the display backboard to form a complete micro-LED display device.

Wherein, in the step S10, the LED single crystal film layer is prepared of a metal organic compound by a chemical vapour deposition (CVD) method at a temperature above 1000° C. The substrate is a sapphire substrate, a silicon carbide substrate, or a silicon substrate. In the step S30, the dielectric layer is made of silicon oxide, silicon nitride, or insulating organic material. In step S40, the molten metal dots are made of metallic tin.

Referring to FIGS. 2 to 10, they are schematic views of the first to ninth structures of the micro-LED display device during manufacturing process provided by the embodiments of the present disclosure, respectively. The structure in FIG. 2 includes a substrate 1 and an LED single crystal film layer 2. The LED single crystal film layer 2 is deposited on the substrate 1.

Figure 3:
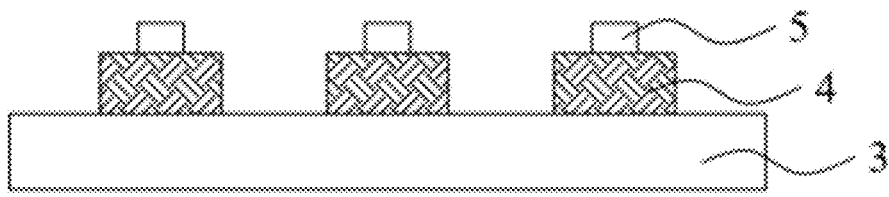
FIG. 3 is a second schematic view of the manufacturing method of the micro-LED display device according to an embodiment of the present disclosure.

The structure in FIG. 3 includes a display backboard 3, a driving circuit 4 and touch spots 5. The touch spots 5 are disposed on a side of the driving circuit 4 facing away from the display backboard 3.

Figure 4:
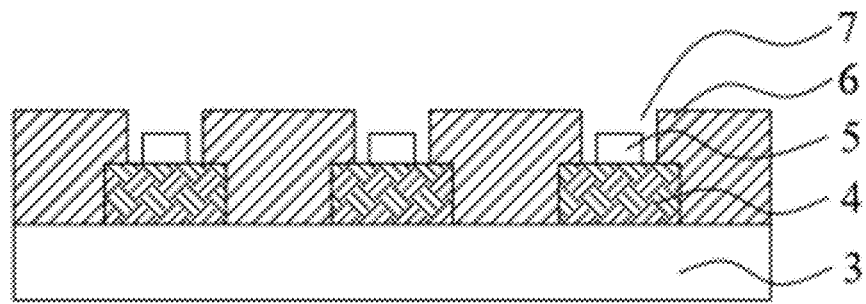
FIG. 4 is a third schematic view of the manufacturing method of the micro-LED display device according to an embodiment of the present disclosure.

In addition to the display backboard 3, the driving circuit 4 and the touch spots 5, in FIG. 4 a dielectric layer 6 is sequentially deposited on a side of the display backboard 3 where the driving circuit 4 is disposed. A height of the dielectric layer 6 is greater than a sum of heights of the driving circuit 4 and the touch spot 5. Through holes 7 are provided directly above the driving circuit 4 and the touch spots 5. A width of the through holes 7 is less than a width of the driving circuit 4 and is greater than a width of the touch spots 5.

Figure 5:
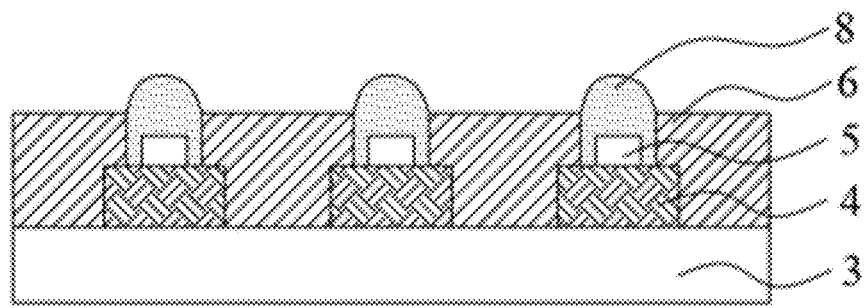
FIG. 5 is a fourth schematic view of the manufacturing method of the micro-LED display device according to an embodiment of the present disclosure.

In FIG. 5, on a side of the display backboard 3 where the dielectric layer 6 is disposed, molten metal dots 8 are sequentially formed at the through holes 7 so that the through holes 7 are completely filled.

Figure 6:
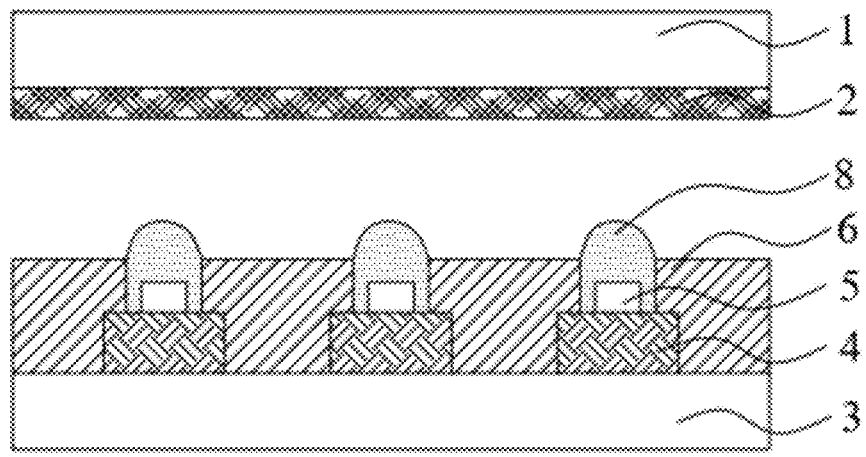
FIG. 6 is a fifth schematic view of the manufacturing method of the micro-LED display device according to an embodiment of the present disclosure.

In FIG. 6, the substrate 1 on which the LED single crystal film layer 2 is deposited is aligned with the display backboard 3, so that one side of the LED single crystal film layer is directly opposite to a side of the dielectric layer 6 having the metal dots 8.

Figure 7:
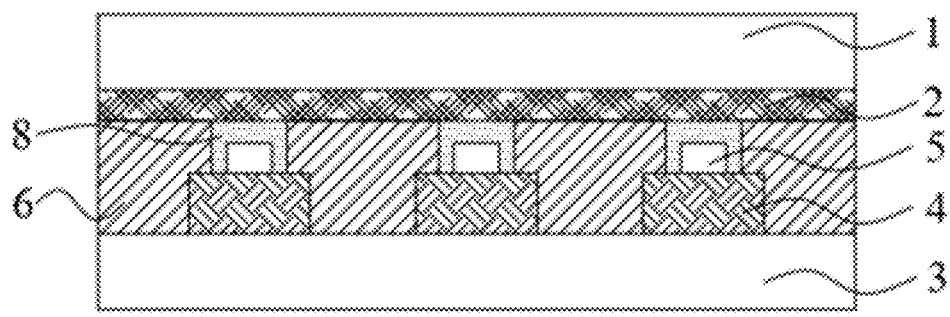
FIG. 7 is a sixth schematic view of the manufacturing method of the micro-LED display device according to an embodiment of the present disclosure.

In FIG. 7, pressure is applied to the substrate 1 facing away from the LED single crystal film layer 2 and a side of the display backboard 3 facing away from the dielectric layer 6, respectively, so that the LED single crystal film layer 2 and the dielectric layer 6 are completely attached and bonded together. Metal material with a low melting point, such as tin, indium, lead, or bismuth, but not limited to these low melting point metal materials, is used to bond the LED single crystal film layer 2 and the dielectric layer 6, and the bonding is performed by a low-temperature welding technology.

Figure 8:
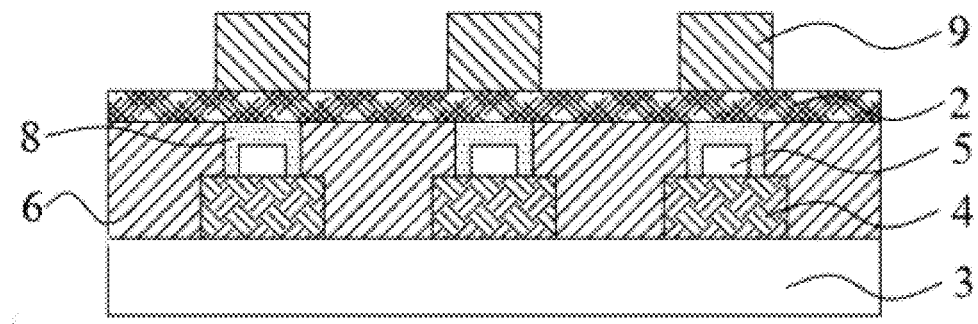
FIG. 8 is a seventh first schematic view of the manufacturing method of the micro-LED display device according to an embodiment of the present disclosure.

In FIG. 8, the substrate 1 is peeled from an entirety of the LED single crystal film layer 2 and the display back plate 3 by laser.

Figure 9:
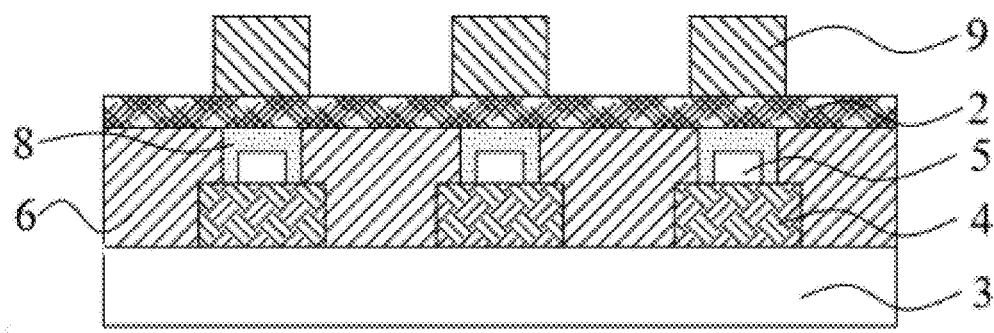
FIG. 9 is an eighth schematic view of the manufacturing method of the micro-LED display device according to an embodiment of the present disclosure.

In FIG. 9, a side of the LED single crystal film layer 2 facing away from the display backboard 3 performs by a yellow light and an etching process to form a micro-LED array 9.

Figure 10:
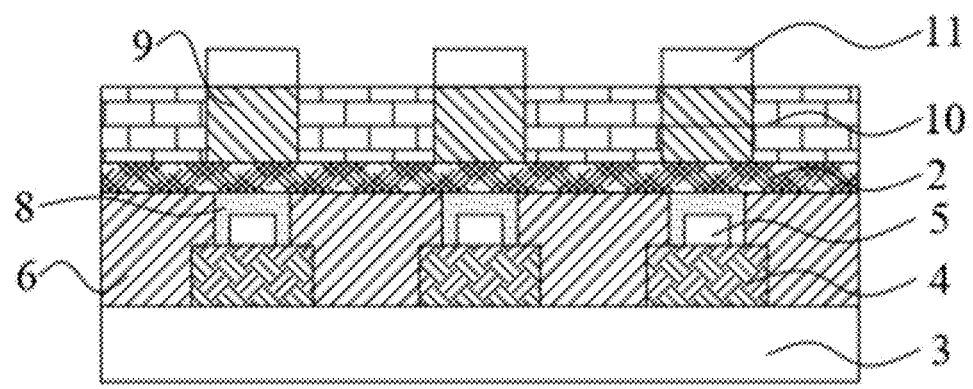
FIG. 10 is a ninth schematic view of the manufacturing method of the micro-LED display device according to an embodiment of the present disclosure.

In FIG. 10, a protective layer 10 and a transparent electrode layer 11 are sequentially filled on a side of the dielectric layer 2 facing away from the display backboard 3 to form a complete micro-LED display device.

The manufacturing method of the micro-LED display device provided in the embodiments of the present disclosure has been described in detail above. Specific examples are used herein to explain principle and implementation of the present disclosure. The description of the above embodiments is only used to help understand the technical solution of the present disclosure and its core ideas; it will be understood by those of ordinary skill in the art that the technical solutions described in the foregoing embodiments may be modified or equivalently substituted for some or all of the technical features, and the modifications or substitutions do not depart from the scope of the technical solutions of the embodiments of the present disclosure.

What is claimed is:

1. A manufacturing method of a micro-LED display device, comprising following steps:
   S10, providing a substrate and depositing an LED single crystal film layer on the substrate at an ambient temperature greater than 1000° C.;
   S20, providing a display backboard, manufacturing a driving circuit on the display backboard, and disposing touch spots on a side of the driving circuit facing away from the display backboard;
   S30, covering the driving circuit of the display backboard with a dielectric layer, and defining through holes in the dielectric layer, and the through holes directly facing the touch spots;
   S40, forming molten metal dots above the touch spots along the through holes;
   S50, aligning the substrate on which the LED single crystal film layer is deposited with the display backboard, so that one side of the LED single crystal film layer is directly opposite to a side of the dielectric layer having the metal dots;
   S60, applying pressure to the substrate facing away from the LED single crystal film layer and a side of the display backboard facing away from the dielectric layer, respectively, so that the LED single crystal film layer and the dielectric layer are completely attached and bonded together;
   S70, peeling the substrate from an entirety of the LED single crystal film layer and the display backboard;
   S80, performing a yellow light process and an etching process on a side of the LED single crystal film layer facing away from the display backboard to form a micro-LED array; and
   S90, forming a protective layer by a filling process and a transparent electrode layer on a side of the dielectric layer facing away from the display backboard to form a complete micro-LED display device.
2. The manufacturing method of the micro-LED display device in claim 1, wherein in the step S10, the LED single crystal film layer is prepared by a chemical vapour deposition method of a metal organic compound.
3. The manufacturing method of the micro-LED display device in claim 1, wherein in the step S10, the substrate is a sapphire substrate, a silicon carbide substrate, or a silicon substrate.
4. The manufacturing method of the micro-LED display device in claim 1, wherein the dielectric layer is made of silicon oxide, silicon nitride, or insulating organic material.
5. The manufacturing method of the micro-LED display device in claim 4, wherein a height of the dielectric layer is greater than a sum of heights of the driving circuit and the touch spot; and a width of the through holes is less than a width of the driving circuit and is greater than a width of the touch spots.
6. The manufacturing method of the micro-LED display device in claim 1, wherein the molten metal dots are made of metallic tin.
7. The manufacturing method of the micro-LED display device in claim 1, wherein when the substrate provided with the LED single crystal film layer and the display backboard provided with the dielectric layer are bonded in step S60, the LED single crystal film layer and the dielectric layer are bonded with a low melting metal material.
8. The manufacturing method of the micro-LED display device in claim 7, wherein the low melting metal material is tin, indium, lead, or bismuth.
9. The manufacturing method of the micro-LED display device in claim 7, wherein bonding between the LED single crystal film layer and the dielectric layer is performed by a low-temperature welding technology.
10. The manufacturing method of the micro-LED display device in claim 9, wherein in the step S70, the substrate is peeled by laser.
11. A manufacturing method of a micro-LED display device, comprising following steps:
    S10, providing a substrate and depositing an LED single crystal film layer on the substrate;
    S20, providing a display backboard, manufacturing a driving circuit on the display backboard, and disposing touch spots on a side of the driving circuit facing away from the display backboard;
    S30, covering the driving circuit of the display backboard with a dielectric layer, and defining through holes in the dielectric layer, and the through holes directly facing the touch spots;
    S40, forming molten metal dots above the touch spots along the through holes;
    S50, aligning the substrate on which the LED single crystal film layer is deposited with the display backboard, so that one side of the LED single crystal film layer is directly opposite to a side of the dielectric layer having the metal dots;
    S60, applying pressure to the substrate facing away from the LED single crystal film layer and a side of the display backboard facing away from the dielectric layer, respectively, so that the LED single crystal film layer and the dielectric layer are completely attached and bonded together;
    S70, peeling the substrate from an entirety of the LED single crystal film layer and the display backboard;
    S80, performing a yellow light process and an etching process on a side of the LED single crystal film layer facing away from the display backboard to form a micro-LED array; and
    S90, forming a protective layer by a filling process and a transparent electrode layer on a side of the dielectric layer facing away from the display backboard to form a complete micro-LED display device.

12. The manufacturing method of the micro-LED display device in claim 11, wherein in the step S10, the LED single crystal film layer is prepared by a chemical vapour deposition method of a metal organic compound.

13. The manufacturing method of the micro-LED display device in claim 11, wherein in the step S10, the substrate is a sapphire substrate, a silicon carbide substrate, or a silicon substrate.

14. The manufacturing method of the micro-LED display device in claim 11, wherein the dielectric layer is made of silicon oxide, silicon nitride, or insulating organic material.

15. The manufacturing method of the micro-LED display device in claim 14, wherein a height of the dielectric layer is greater than a sum of heights of the driving circuit and the touch spot; and a width of the through holes is less than a width of the driving circuit and is greater than a width of the touch spots.

16. The manufacturing method of the micro-LED display device in claim 11, wherein the molten metal dots are made of metallic tin.

17. The manufacturing method of the micro-LED display device in claim 11, wherein when the substrate provided with the LED single crystal film layer and the display backboard provided with the dielectric layer are bonded in step S60, the LED single crystal film layer and the dielectric layer are bonded with a low melting metal material.

18. The manufacturing method of the micro-LED display device in claim 17, wherein the low melting metal material is tin, indium, lead, or bismuth.

19. The manufacturing method of the micro-LED display device in claim 17, wherein bonding between the LED single crystal film layer and the dielectric layer is performed by a low-temperature welding technology.

20. The manufacturing method of the micro-LED display device in claim 19, wherein in the step S70, the substrate is peeled by laser.

* * * * *